(12) United States Patent
Sessions

(10) Patent No.: US 6,198,306 B1
(45) Date of Patent: Mar. 6, 2001

(54) CMOS WAVESHAPING BUFFER

(75) Inventor: D. C. Sessions, Phoenix, AZ (US)

(73) Assignee: VLSI Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/121,957

(22) Filed: Jul. 24, 1998

(51) Int. Cl.[7] .............................................. H03K 19/094
(52) U.S. Cl. .............................................. 326/83; 326/121
(58) Field of Search ................................ 326/83, 86, 112, 326/119, 121, 26, 27; 327/391

(56) References Cited

U.S. PATENT DOCUMENTS

| | | | |
|---|---|---|---|
| 3,914,702 | * | 10/1975 | Gehweiler ........................... 330/264 |
| 4,532,439 | * | 7/1985 | Koike ..................................... 326/25 |
| 5,012,141 | * | 4/1991 | Tomisawa ............................ 327/276 |
| 5,113,150 | * | 5/1992 | Waizman ............................. 330/264 |
| 5,179,298 | * | 1/1993 | Hirano et al. ........................... 326/83 |
| 5,828,235 | * | 10/1998 | Horiguchi et al. ................... 326/121 |

* cited by examiner

*Primary Examiner*—Michael Tokar
*Assistant Examiner*—James H Cho
(74) *Attorney, Agent, or Firm*—LaValle D. Ptak

(57) ABSTRACT

A CMOS wave shaping buffer circuit comprises two CMOS inverter stages connected as a non-inverting buffer. In addition, the two stages are further coupled by way of their supply connections to produce a positive feedback from the second stage to the first whenever both stages are driven to a linear state, that is both transistors of each stage are "ON". The positive feedback prevents the output stage from remaining in a logically ambiguous state, but forces crisp transitions from one state to another even for slowly changing input signals.

2 Claims, 2 Drawing Sheets

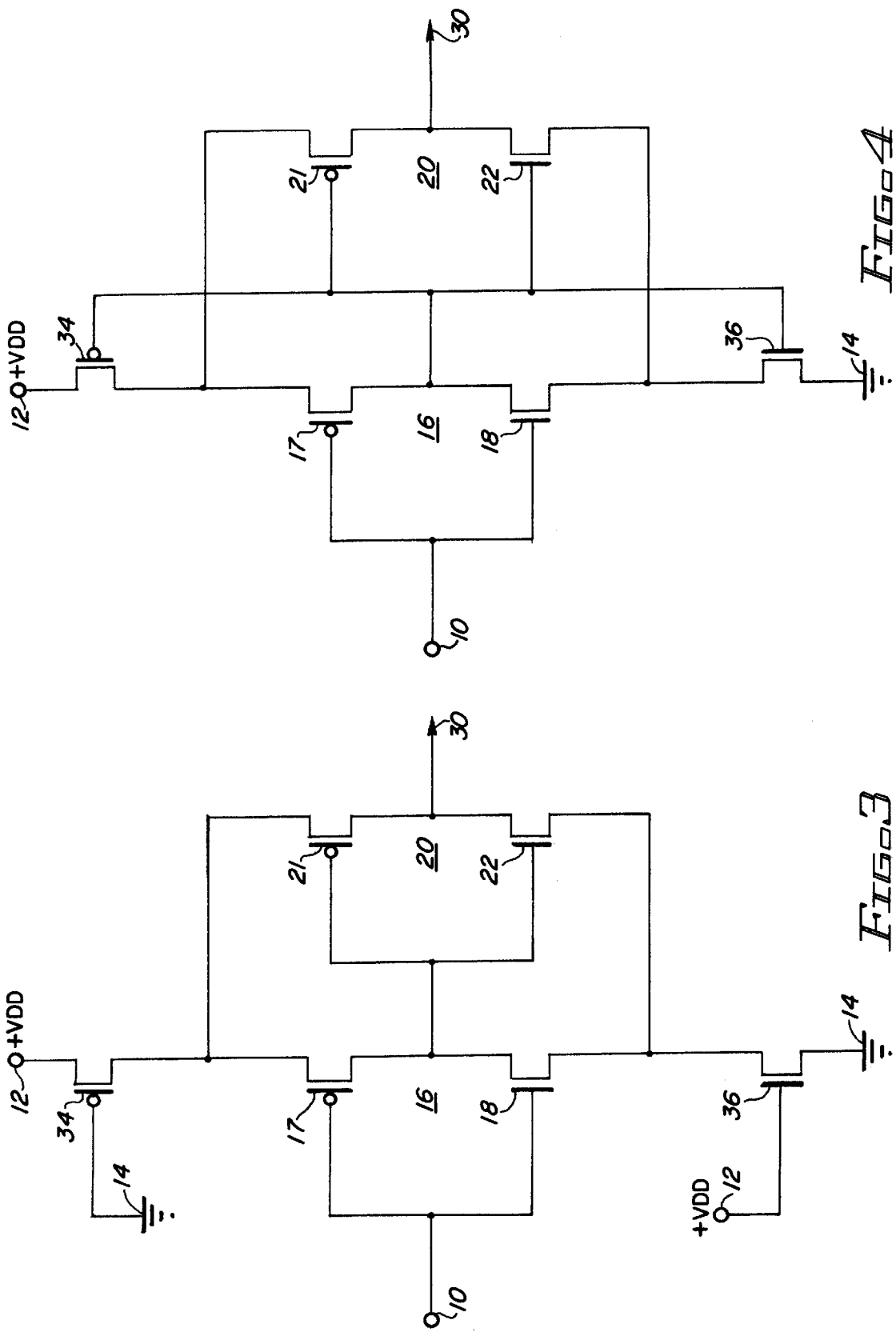

CM OS WAVESHAPING BUFFER

BACKGROUND

The proper operation of CMOS logic, such as buffer amplifiers, requires that the inputs settle to levels near the power supply rails (such as VDD and ground) and that transition between these levels occurs crisply. The realities of system design, however, frequently prevent this from occurring, because the signal levels are not always crisply rail-to-rail, because of high speed analog effects, noise, or other causes.

In the past, CMOS input level-shifters addressed this problem by cascading multiple stages to achieve high net voltage gain around the switch points. This reduced the probability that an internal logic device would be exposed to indeterminate logic states. This approach, however, presents a design trade off. With fewer stages of gain, indeterminate levels result in increased power dissipation and risk of operation faults, while more gain stages have a greater net delay in the signal propagation.

It is desirable to provide an improved CMOS logic level-shifter which produces precise switching, even for slowly changing input signals, and which does not require multiple gain stages to achieve the crisp switching transitions.

SUMMARY OF THE INVENTION

It is an object of this invention to provide an improved CMOS buffer circuit.

It is another object of this invention to provide an improved CMOS waveshaping buffer, the output of which cannot remain in an ambiguous state.

It is an additional object of this invention to provide an improved CMOS buffer employing positive feedback to effect crisp signal transitions at the output.

It is a further object of this invention to provide an improved CMOS wave shaping buffer employing positive feedback from the output stage to the input stage whenever both stages are in their linear state to force crisp switching transitions of the output state.

In a preferred embodiment of the invention, a CMOS logic circuit has an input stage with a P-type MOS transistor and an N-type MOS transistor connected in series between first and second power supply rails, at different voltages. A source of input signals is connected in common to the gates of the input stage transistors. A CMOS output stage has a second P-type MOS transistor and a second N-type MOS transistor connected in series between the first and second power supply rails, with the gates of the output stage transistors coupled in common to the junction between the transistors of the input stage. The transistors of the input stage and the transistors of the output stage are then jointly connected to the positive and negative power supplies through a third P-type MOS transistor and a third N-type MOS transistor. This ensures precise signal switching of the transistors in the output stage, even for slowly changing signals supplied by the source of signals coupled to the gates of the transistors of the input stage.

BRIEF DESCRIPTION OF THE DRAWINGS

FIG. 3 is a schematic diagram of a preferred embodiment of the invention; and

FIG. 4 is a schematic diagram of an alternative embodiment of the invention.

DETAILED DESCRIPTION

Figure 1:
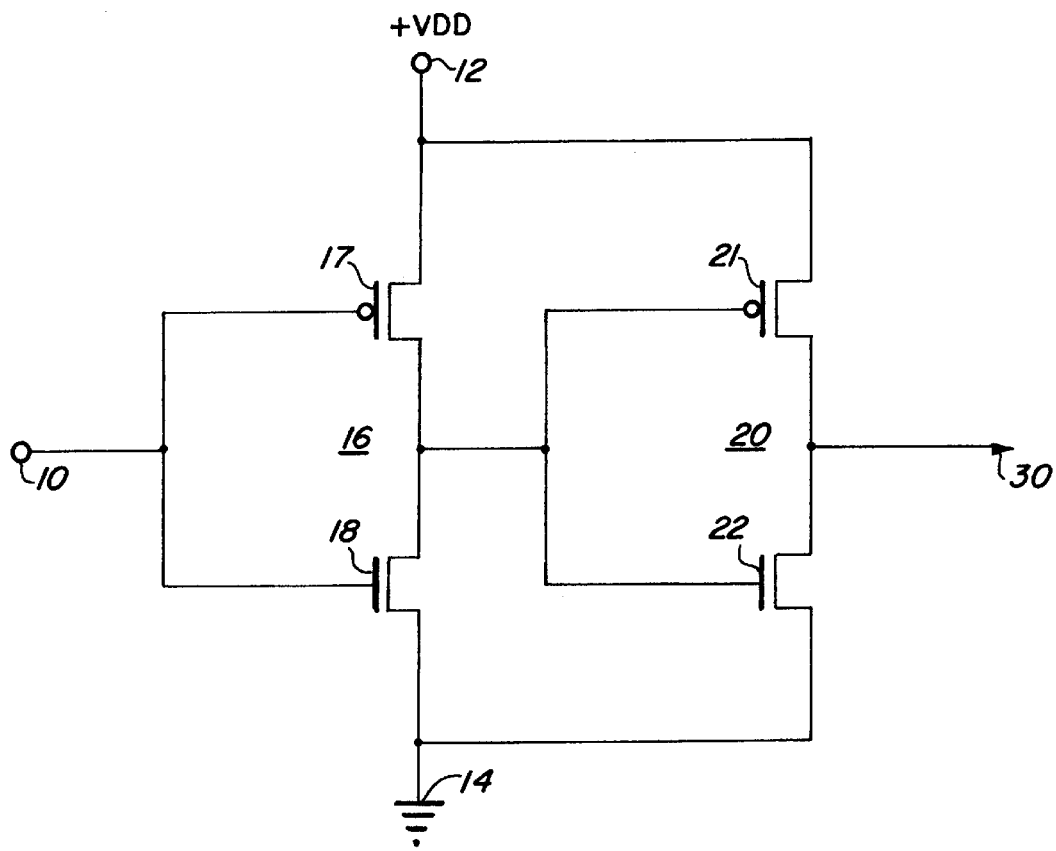
FIG. 1 is a schematic diagram of a prior art CMOS buffer amplifier.

Reference now should be made to the drawings, in which the same reference numbers are used throughout the different figures to designate the same components. FIG. 1 is a schematic diagram of a typical prior art two-stage non-inverting CMOS buffer amplifier. Such an amplifier includes an input amplifier stage 16, consisting of a PMOS transistor 17 and an NMOS transistor 18 with the source-drain paths of the transistors 17 and 18 connected together in series between a positive power supply 12 and a negative power supply 14, shown as connected to ground. The amplifier stage 16 has an input 10 connected in common to the gates of the transistors 17 and 18. The output for the input stage of the amplifier is obtained at the junction between the drain of the PMOS transistor 17 and the drain of the NMOS transistor 18. This output is connected in common to the gates of an output buffer amplifier stage 20 consisting of a PMOS transistor 21 and an NMOS transistor 22, the source-drain channels of which are connected in series between the positive power supply 12 and the negative power supply 14. The output of the stage 20 is obtained from the junction of the drain of the PMOS transistor 21 and the drain of the NMOS transistor 22 at 30.

Figure 2:
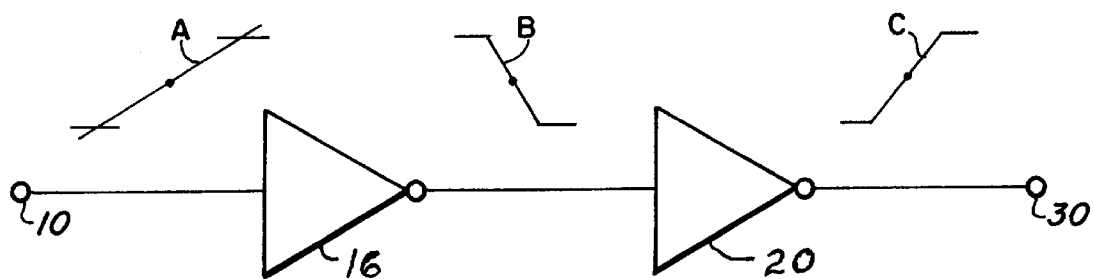
FIG. 2 is a diagrammatic representation of the operation of the circuit shown in FIG. 1.

When an amplifier of the type shown in FIG. 1 is used as a buffer between the input terminal 10 and the output 30, response to slowly changing signal transitions on the input terminal 10 results in the operation which is illustrated in FIG. 2. FIG. 2 diagramamtically shows the two inverting stages 16 and 20. Assume that a slowly changing input signal is applied to the terminal 10, as shown at waveform A in FIG. 2. The horizontal lines on the signal transition A of FIG. 2 represent the negative and positive power supplies, respectively. The switch point for changing the output of the input stage 16 from negative to positive ideally is at the dot shown at the center of the waveform A in FIG. 2. In reality, however, when a slowly changing transition (rather than an abrupt signal transition) at the input 10 takes place, a situation can arise where both of the transistors at 17 and 18 of the input stage 16 are conductive simultaneously. This causes an indeterminate signal output to be obtained from the output terminal of this stage, which is connected to the gates of the transistors 21 and 22 of the output stage 20. This causes the output signal waveform, shown as B in FIG. 2, to take place from the input stage 16.

A similar situation arises for the output stage 20. A slowly changing signal applied to the gates of the CMOS transistors 21 and 22 causes both of the output transistors 21 and 22 to be on in varying amounts during the transition, as illustrated in waveform C. Consequently, precise switching of the output voltage on the terminal 30 does not take place; but rather the indeterminate situation shown as waveform C in FIG. 2 occurs.

With the simple two-stage amplifier shown in FIG. 1, indeterminate input levels of the type shown in FIG. 2 result in increased power dissipation, since it is possible that all four transistors in both stages 16 and 20 may be turned on simultaneously, at least for the transition periods which are illustrated in waveforms B and C. This results in increased power dissipation and also exposes the circuit with which the buffer of FIG. 1 is used to the risk of operation faults. As mentioned previously, this can be corrected by adding more gain stages; but increased gain stages causes a greater net delay in signal propagation through the amplifier.

FIGS. 3 and 4 illustrate the utilization of a positive feedback circuit from the output stage to the input stage for ensuring that the output stage cannot remain in an indefinite state of operation (where both of the output transistors 21 and 22 are conductive in the same or differing amounts) even though the input signal level changes relatively slowly rather than abruptly. In FIG. 3, the positive feedback is accomplished by the addition of a PMOS transistor 34 connected between the sources of the PMOS transistors 17 and 21 and the positive power supply 12. Similarly, an NMOS transistor 36 is connected between the sources of the NMOS transistors 18 and 22 and the negative power supply 14. The feedback is accomplished by limiting the current available to transistor pairs 17-21 and 18-22, such that both pairs cannot simultaneously operate in their linear modes.

The result of this is that the output stage 20 is prevented from exhibiting a lengthy indeterminate state, such as illustrated by the waveform C in FIG. 2 in conjunction with the prior art circuit shown in FIG. 1. This result is prevented, since the positive feedback effected by the transistors 34 and 36 causes the output stage 20 to be made very unstable. It cannot remain hung up with both transistors 21 and 22 on. One or the other must turn off as a result of the positive feedback. As a consequence, abrupt switching of the output stage 20 under control of the output provided from the input stage 16 to the gates of the transistors 21 and 22 is ensured.

It should be noted that it still is possible for slow switching of the input stage transistors 17 and 18 to take place in the manner described above previously in the description of the operation of the circuit of FIG. 1. Whenever the signal level, however, at the gates of the output stage transistors 21 and 22 crosses the center point shown by the dot in the center of the waveform B of FIG. 2, rapid and crisp switching from a fully "on" state of one of the transistors 21 and 22 to the other immediately takes place. The coupling provided by the transistors 34 and 36 causes positive feedback from the output stage 20 to the input stage 16 whenever both stages tend to be in their linear state, that is when both transistors of both stages 16 and 20 are on. Because of the positive feedback, the output stage 20 cannot remain in such an ambiguous state; but instead, it transitions crisply from one state to the other, even though the input signal on terminal 10 may be slowly changing.

The addition of the transistors 34 and 36 to form the positive feedback has no effect whatsoever on crisp or "well-behaved" inputs. In such a situation, the buffer acts similarly to a conventional two-stage buffer when it is provided with abruptly changing input signals on the terminal 10. The only drawback for abruptly changing inputs is that there is a higher input capacitance for the same drive level on the terminal 10 as a result of the larger device sizes dictated by having two stacked transistors, such as 17 and 34, for both pull-down and pull-up of the amplifier.

The circuit of FIG. 4 operates in a manner similar to that of FIG. 3. The positive feedback transistors 34 and 36, however, have their gates connected to the gates of the transistors 21 and 22, which, as described in conjunction with FIG. 3, are connected to the output of the input stage 16. The circuit of FIG. 4 generally operates in the same manner as the circuit of FIG. 3. The transistors 34 and 36, however, in the configuration shown in FIG. 3, cause the circuit to operate as a tri-state buffer by controlling the gates of the additional transistors 34 and 36 through the connections described to selectively turn off the transistors 34 and 36. The same result of the positive feedback produced by the transistors 34 and 36, however, causes the precise switching desired to take place in conjunction with the circuit of FIG. 4, as well as the circuit of FIG. 3, described previously.

Although the additional CMOS transistors 34 and 36 have been described in the embodiments shown in FIGS. 3 and 4, higher drive versions can be implemented in smaller chip areas, with less capacitance, by using resistors instead of transistors for the transistors 34 and 36. The operation of the circuits of either the buffer amplifier of FIG. 3 or the tri-state circuit of FIG. 4, when resistors are used in place of the transistors 34 and 36, is substantially the same as described above in conjunction with the circuits specifically shown in FIGS. 3 and 4.

Abrupt switching of the output stage 20, even though the input signal applied to the input terminal 10 may vary relatively slowly, is effected by the circuits which are shown. The circuits of FIGS. 3 and 4 result in reduced power consumption, since the output stage 20 cannot be left in an indeterminate state even though the input stage 16 may operate, at least part of the time, with both of the transistors 17 and 18 conductive. When large numbers of buffer amplifiers of either of the types shown in FIGS. 3 and 4 are used in a system, this reduced power consumption may be significant.

The foregoing description of the preferred embodiment of the invention is to be considered illustrative, and not as limiting. Various changes and modifications will occur to those skilled in the art for performing substantially the same function, in substantially the same way, to achieve substantially the same result, without departing from the true scope of the invention as defined in the appended claims.

What is claimed is:

1. A CMOS logic circuit having input and output stages coupled to prevent the output stage from remaining in an ambiguous logic state including in combination:

positive and negative power supplies;

a CMOS input stage having a first P-type MOS transistor and a first N-type MOS transistor, each having a source, a drain and a gate, with the drain of said P-type MOS transistor connected at a first junction with the drain of said first N-type MOS transistor, placing the source-drain channels of said first transistors in series circuit with one another;

a source of input signals coupled in common to the gates of said first P-type MOS transistor and said first N-type MOS transistor;

a CMOS output stage having a second P-type MOS transistor and a second N-type MOS transistor, each having a source, a drain and a gate, with the drain of said second P-type MOS transistor coupled at a second junction with the drain of said second N-type MOS transistor placing the source-drain channels of said second transistors in series circuit with one another;

the gates of said second transistors coupled in common to said first junction;

an output terminal coupled with said second junction;

a positive feedback circuit coupled between said second transistors and said first transistors to ensure precise signal switching at said second junction even for slowly changing signals at said source of input signals, said positive feedback circuit including a third P-type MOS transistor and a third N-type MOS transistor, each having a source, a drain and a gate, with the gates of said third transistors coupled in common to the gates of said second transistors, with the source of said third P-type MOS transistor connected to said positive power supply, the drain of said third P-type MOS transistor coupled with the sources of said first and second P-type MOS transistors, the drain of said third N-type MOS transistor coupled with the sources of said first and second N-type MOS transistor, and the source of said third N-type MOS transistor coupled with the negative power supply.

2. The CMOS logic circuit according to claim 1 wherein said third P-type MOS transistor and said third N-type MOS transistor are controlled via their gates so as to be either fully conductive or fully non-conductive, the output to be in a high impedance state.

* * * * *